(12) United States Patent
Bayes et al.

(10) Patent No.: US 11,843,153 B2
(45) Date of Patent: Dec. 12, 2023

(54) USE OF ENHANCED PERFORMANCE ULTRACONDUCTIVE COPPER MATERIALS IN CYLINDRICAL CONFIGURATIONS AND METHODS OF FORMING ULTRACONDUCTIVE COPPER MATERIALS

(71) Applicant: TE Connectivity Services GmbH, Schaffhausen (CH)

(72) Inventors: Martin W. Bayes, Hopkinton, MA (US); Gokce Gulsoy, San Jose, CA (US); Ting Gao, Palo Alto, CA (US); David Bruce Sarraf, Elizabethtown, PA (US); Chad William Morgan, Carneys Point, NJ (US); Rodney Ivan Martens, Mechanicsburg, PA (US)

(73) Assignee: TE CONNECTIVITY SOLUTIONS GMBH, Schaffhausen (CH)

( * ) Notice: Subject to any disclaimer, the term of this patent is extended or adjusted under 35 U.S.C. 154(b) by 0 days.

(21) Appl. No.: 16/816,968

(22) Filed: Mar. 12, 2020

(65) Prior Publication Data

US 2020/0295427 A1 Sep. 17, 2020

Related U.S. Application Data

(60) Provisional application No. 62/817,108, filed on Mar. 12, 2019, provisional application No. 62/817,102, filed on Mar. 12, 2019, provisional application No. 62/817,112, filed on Mar. 12, 2019.

(51) Int. Cl.
*H01P 3/06* (2006.01)
*H01B 1/02* (2006.01)
*H01P 11/00* (2006.01)
*C23C 16/26* (2006.01)

(52) U.S. Cl.
CPC ............... *H01P 3/06* (2013.01); *H01B 1/026* (2013.01); *H01P 11/005* (2013.01); *C23C 16/26* (2013.01)

(58) Field of Classification Search
CPC .......... H01P 3/06; H01P 11/055; H01B 1/026; C23C 16/26
See application file for complete search history.

(56) References Cited

U.S. PATENT DOCUMENTS 3,555,169 A    1/1971 Miller
6,770,976 B2    8/2004 Wang et al.
(Continued)

FOREIGN PATENT DOCUMENTS

CN    201608140 U    10/2010
CN    201937220 U    8/2011
(Continued)

OTHER PUBLICATIONS

Lee, Dominic F and Burwell, Malcolm, "Priority Research Areas to Accelerate the Development of Practical Ultraconductive Copper Conductors", ORNL/TM-2015/403, Sep. 2015.
(Continued)

*Primary Examiner* — Andrea Lindgren Baltzell
*Assistant Examiner* — Kimberly E Glenn

(57) ABSTRACT

The present invention relates to use of an enhanced performance ultraconductive copper composite cylindrical conduit. The ultraconductive copper composite cylindrical conduit has enhanced RF conductivity.

7 Claims, 6 Drawing Sheets

(56) References Cited

U.S. PATENT DOCUMENTS

| | | | |
|---|---|---|---|
| 7,754,964 B2* | 7/2010 | Kempa | H01L 31/07 |
| | | | 136/255 |
| 9,287,599 B1 | 3/2016 | White et al. | |
| 9,526,195 B2 | 12/2016 | Su | |
| 10,047,236 B1 | 8/2018 | Druffel et al. | |
| 10,109,904 B2* | 10/2018 | Lee | H01P 3/081 |
| 10,173,253 B2 | 1/2019 | Nayfeh et al. | |
| 2013/0248229 A1 | 9/2013 | Martens | |
| 2013/0292161 A1 | 11/2013 | Liu et al. | |
| 2014/0352869 A1 | 12/2014 | Wasynczuk | |
| 2015/0333424 A1 | 11/2015 | Elsbernd et al. | |
| 2017/0115074 A1 | 4/2017 | Cheng | |
| 2018/0102197 A1 | 4/2018 | Adams et al. | |
| 2018/0330842 A1 | 11/2018 | Rastogi et al. | |
| 2019/0062921 A1 | 2/2019 | Adams | |
| 2019/0066879 A1 | 2/2019 | Adams | |
| 2019/0066882 A1 | 2/2019 | Adams | |
| 2019/0267153 A1 | 8/2019 | Kappagantula et al. | |
| 2020/0020462 A1* | 1/2020 | Garrett | H01B 11/1813 |
| 2022/0199280 A1 | 6/2022 | Lekarski et al. | |

FOREIGN PATENT DOCUMENTS

| | | | |
|---|---|---|---|
| CN | 102560415 A | | 7/2012 |
| CN | 103429333 A | | 12/2013 |
| CN | 105097063 A | | 11/2015 |
| CN | 205946210 U | * | 2/2017 |
| EP | 0342669 B1 | | 8/1995 |
| WO | WO-2017/065530 A1 | | 4/2017 |

OTHER PUBLICATIONS

Fraunhofer Institute for Machine Tools and Forming Technology IWU, "Electromagnetic Forming", 2016, http://www.iw.fraunhofer.de.

Horst Adams, "Final Report—Ultra-Conductive Copper Development in China", International Copper Association, Aug. 29, 2016, https://copperalliance.org/wp-content/uploads/2021/08/report-ultra-conductive-copper-development.pdf.

Kaplas et al., "Few-layer graphene synthesis on a dielectric substrate", Carbon, 50 (2012), 1503-1509.

Sandoz-Rosado et al., "Reducing contact resistance of macro-scale separable electrical contacts with single-layer graphene coatings", IEEE (2014).

Cho et al., "Growth of monolayer graphene on nanoscale copper-nickel alloy thin films", Carbon 115 (2017) 441-448.

Search Report for Chinese Application No. 202010169425.0, dated May 25, 2021, pp. 8-9.

* cited by examiner

USE OF ENHANCED PERFORMANCE ULTRACONDUCTIVE COPPER MATERIALS IN CYLINDRICAL CONFIGURATIONS AND METHODS OF FORMING ULTRACONDUCTIVE COPPER MATERIALS

CROSS REFERENCE TO RELATED APPLICATIONS

This non-provisional application claims the benefit under 35 U.S. Code § 119(e) of Provisional Application Ser. No. 62/817,112 filed Mar. 12, 2019 entitled USE OF ENHANCED PERFORMANCE ULTRACONDUCTIVE COPPER MATERIALS IN CYLINDRICAL CONFIGURATIONS, Provisional Application Ser. No. 62/817,108 filed Mar. 12, 2019 entitled SYNTHESIS OF ULTRACONDUCTIVE METAL-CARBON COMPOSITES ON CYLINDRICAL SUBSTRATES and Provisional Application No. 62/817,102 filed Mar. 12, 2019 entitled REEL TO REEL PROCESS OF FORMING ULTRACONDUCTIVE METAL CARBON COMPOSITE WIRE AND TAPE AND USES THEREOF and whose entire disclosures are incorporated by reference herein.

FIELD OF THE INVENTION

The present invention is directed to a use of enhanced performance ultraconductive copper materials in cylindrical configurations with improved RF conductivity and method of forming of such.

BACKGROUND OF THE INVENTION

Copper is used for electrical and electronic purposes in the world as a cost-effective and reliable conductive material for many applications. Copper is only second to silver in its ability to conduct electricity. Substantial research efforts have been devoted to enhance the conductivity of copper by making composites of copper with carbon nanotubes to form ultraconductive copper. Ultraconductive copper has promises of enhanced electrical conductivity, higher strength and better thermal management characteristics. These research efforts have been focused on increasing the bulk (DC) conductivity of the ultraconductive copper or increasing its physical properties such as wear resistance. Many of these research efforts have been focused on layered ultraconductive copper materials. However, none of these efforts have been focused on improving the RF conductivity of the ultraconductive copper materials in cylindrical applications.

U.S. Patent Publication No. 2018/0330842 A1 describes a layered metal-graphene-metal nanolaminate electrical connector with improved wear performance and reduced friction. The electrical connector has a chemical vapor deposition monolayer graphene sheet sandwiched between two copper layers resulting in a decrease in the coefficient of friction and in improvement in wear resistance of an electrical contact.

U.S. Patent Publication No. 2018/0102197 A1 describes a composite structure having a copper layer and a first and second graphene layer that sandwiches the copper layer. The composite structure provides electron path tunnels between the copper layer and the first and second graphene layers. The electron path tunnels may enhance the bulk electrical conductivity. This publication also describes a multilayer composite structure which comprises a first copper layer, a first graphene layer on the first copper layer, a second graphene layer on the first graphene layer and a second copper layer on the second graphene layer.

The report, "Priority Research Areas to Accelerate the Development of Practical Ultraconductive Copper Conductors" by Lee and Burwell (ORNL/TM -2015/403) describes ultraconductive copper materials. The report states that many processes that are being developed to produce ultraconductive materials are not shaped for commercial applications, such as wires. The report further notes that use of carbon nanotubes in existing processes to produce wire has been unsuccessful due to separation of the carbon nanotube inclusions from the melt due to differences in carbon nanotube and copper densities resulting in inhomogenous distribution of the carbon nanotubes. The report also discusses combining ultraconductive copper synthesis with wire formation in a single process. According to the report, attempts have been made to deposit copper electrolytically into wire. The authors of the report question the viability of such a process due to the high process costs and necessary post processing treatment steps. The report does not address the enhanced RF conductivity of an ultraconductive copper material that is made into a cylindrical configuration.

U.S. Pat. No. 10,173,253 describes a method for the development of commercial scale nano-engineered ultraconductive copper wire. When forming ultraconductive wire, multi-walled carbon nanotubes are dispersed and de-agglomerated in hot metal. The multi-walled carbon nanotubes are dispersed in a precursor matrix via mixing and sintering to form a precursor material which is hot extruded multiple rounds at a predetermined temperature to form a nano-composite material. The nano-composite material is subjected to multiple rounds of hot extrusion to form a ultraconductive material which is then drawn to form an ultraconductive wire.

Co-pending, commonly assigned, U.S. application Ser. No. 16/816,493, filed concurrently herewith, entitled "Enhanced Performance Ultraconductive Copper" describes a novel multilayer ultraconductive copper composite structure with enhanced RF conductivity. This application discloses an ultraconductive composite having at least two composite layers and an interface between such layers which is sufficiently close to the surface of the ultraconductive composite thereby enhancing the RF conductivity of the composite.

It would, therefore, be beneficial to make an ultraconductive copper composite having improved or enhanced RF conductivity capable of being used in a cylindrical configuration where it is difficult to use multilayered composites as small diameters are required. More particularly, it would be beneficial to obtain a cylindrical ultraconductive copper primary conductor with enhanced or improved RF conductivity. In addition, it would be beneficial to have processes to form ultraconductive copper composites which can be used in cylindrical configurations.

SUMMARY OF THE INVENTION

An embodiment of the invention is directed to an ultraconductive copper composite cylindrical conduit having enhanced RF conductivity comprising an inner core, an outer shell surrounding the inner core, a graphene layer on the outer shell and an outer copper layer.

Another aspect of the invention relates to a method of forming an ultraconductive copper composite cylindrical conduit having enhanced RF conductivity in which an outer shell is placed on the inner core. A graphene layer is grown on the outer shell. Next a layer of copper is deposited on the graphene layer.

An aspect of the invention relates to a method of forming an ultraconductive metal-carbon composite on cylindrical substrates having enhanced RF conductivity.

Another aspect of the invention relates to a cylindrical conduit formed by the method of forming an ultraconductive metal-carbon composite on a cylindrical substrate having enhanced RF conductivity.

Yet another aspect of the invention relates to a reel to reel process of forming an ultraconductive metal-carbon composite wire or tape having enhanced RF conductivity.

Another further aspect of the invention relates to the use of wire having enhanced RF conductivity formed by the reel to reel process in other applications such as long cable wires.

A further aspect of the invention relates to the use of tape having enhanced RF conductivity formed by the reel to reel process in other applications such as electric motors and solenoids Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

Figure 1:
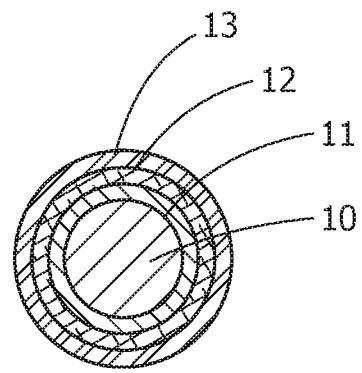
FIG. 1 shows a schematic of a ultraconductive copper cylindrical conduit having improved RF conductivity.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise.

Moreover, the features and benefits of the invention are illustrated by reference to the preferred embodiments. Accordingly, the invention expressly should not be limited to such embodiments illustrating some possible non-limiting combination of features that may exist alone or in other combinations of features, the scope of the invention being defined by the claims appended hereto.

The present invention relates to uses of ultraconductive copper composite cylindrical conduit which possesses improved RF conductivity over copper conduits alone.

RF conductivity comes into play as a result of the attenuation due to finite metal conductivity. RF conductivity is significant in longer transmission lines, antennas and radio frequency and microwave circuits. The enhancement of RF conductivity would reduce losses, allowing for the creation of longer transmission lines and improved selectivity resonator structures. The overall loss of most transmission lines is dominated by the metal loss at microwave frequencies. Metal loss is proportional to square-root of frequency. Metal loss is modeled by the R' component in the transmission line model which is series resistance per unit length. The R' component is a function of the geometry of the transmission line and the RF sheet resistance of the metal system that is used. The RF sheet resistance is generally greater than the DC sheet resistance due to skin effect. Skin effect is the tendency of high frequency current to be highest at the surface of the conductor and then decay exponentially toward the center or interior of the conductor, instead of flowing uniformly within the entire conductor. The higher the frequency, the greater the tendency for this to occur. The skin depth is defined as a depth used to approximate the effective cross-sectional area of a conductor when the skin effect is limiting that area. Therefore, to obtain improved RF conductivity at a desired frequency, the thickness of the outer copper layers(s) of any ultraconductive copper composite structure must be significantly less than the skin depth of copper at that frequency. For a composite structure produced using 30 micron copper foils such as the composite in US Patent Publication 2018/0102197, it would be expected that any enhancement of RF conductivity would be limited to frequencies well below the frequency (ca. 4.7 MHz) at which the skin depth of copper is 30 microns. At higher frequencies, the skin depth becomes progressively smaller. For copper, the skin depth falls to approximately 2 microns at a frequency of 1 GHz and to about 0.46 microns at 20 Ghz. Producing layers of copper which are so thin is difficult since such layers are very fragile and difficult to handle in manufacturing situations. Locating a material with overall better conductivity near the surface of the composite also helps with the enhancement of the RF conductivity.

The present invention provides for an ultraconductive copper composite cylindrical conduit which has enhanced RF conductivity. The present invention can be used to make ultraconductive copper composite conduits which can be used in a desired frequency. Example of frequencies in which the ultraconductive copper composite cylindrical conduit can be used range from about 0.5 MHz to about 60 GHz. With this range of frequencies, the conduit will have enhanced RF conductivity if the skin depth is equal to or greater than the radius of inner core. As shown in FIG. 1, the ultraconductive copper composite cylindrical conduit preferably comprises an inner core 10, an outer shell 11 (also referred to as a shell) surface suitable for graphene growth surrounding the inner core, a graphene layer 12 on the outer shell and an outer layer of copper 13 on top of the graphene layer.

The cylindrical conduit of the present invention includes an inner core. The inner core can be a wire. Alternatively, the inner core can be a braided wire in which each strand of the braid is treated, provided that the skin depth is greater than the bundle radius at the specific frequency. Any configuration for the inner core can be used so long as the geometry of the overall configuration meets the requirements of skin depth at the desired frequency. The inner core has an outer shell which is made from material that is suitable for graphene film production. The inner core of the conduit should be formed of a material with physical properties superior to the physical properties of the outer shell. Examples of possible materials which can be used for the inner core include copper nickel silicon alloy or stainless steel. Most preferably the outer shell is a copper material. If copper is used as the outer shell, the roughness of the exterior surface of the copper should be low to minimize RF conductivity loss, preferably less than the skin depth over the frequency range of interest. Alternatively, the inner core and the outer shell can be made entirely of copper. Picking the appropriate wire having the desired properties for end application is well within the skill of one of ordinary skill in the art.

The inner core with the outer shell has a graphene layer deposited on the outer shell. Most preferably, chemical vapor deposition is used to deposit the graphene layer onto the outer shell of the inner core.

Graphene (GR) is a one atom thick two dimensional carbon material that is currently used in electrical, thermal and mechanical applications. The carbon atoms in graphene are covalently bonded in a honeycomb (hexagonal) lattice. Graphene is very thin and flexible, yet conductive. Any amount of graphene coverage or structure of graphene that will provide the desired enhancement of the RF conductivity in the end product can be used. In one embodiment, the graphene surface coverage can be approximately 95% of the surface of the outer shell. In yet another embodiment, the graphene may be a graphene monolayer or a graphene bi-layer or a few layers of graphene provided that the layers maintain the properties of graphene. Although this invention is described for use with graphene, it is equally possibly applicable to inhomogenous copper-carbon nanotube structures which confer analogous improvements in bulk conductivity. One of ordinary skill in the art would be able to use the carbon nanotube structures in place of graphene.

The ultraconductive cylindrical conduit of the invention has an additional outer copper layer placed over the graphene. Copper can be obtained in various thicknesses. The thickness of this copper outer layer is critical to enhance the RF conductivity as described above to avoid issues with skin effect. Additionally, the roughness of the exterior surface of the copper should be low so as to minimize RF conductivity loss, preferably less than the skin depth over the frequency range of interest. Typically, copper foils below 5 microns too fragile and cannot be handled as an individual layer. In such instances, copper can be placed or deposited on a removable carrier substrate. Any removable carrier substrate can be used provided that it can mechanically tolerate the graphene deposition temperature; not interdiffuse with copper during processing in such a way to interfere with graphene growth, has a similar coefficient of expansivity to copper to limit distortion during temperature changes and is removable by a chemical or mechanical process, preferably one that would be selective to the carrier substrate. Preferably, the carrier substrate would have a thickness of at least 20 to about 30 microns. Suitable methods to place or deposit on a carrier substrate include electro-deposition, sputtering, laminating, rolling. U.S. Pat. No. 6,770,976 B2 describes an example of a method for forming a relatively thin release layer of copper on a carrier substrate and is incorporated herein by reference in its entirety. These methods are well known in the art and one of ordinary skill in the art can easily choose the best method to achieve the desired result. If a substrate is used with the copper, the substrate must be easily removable from the copper without damage to the copper itself.

If the copper outer layer of the cylindrical conduit is too thick to achieve the enhanced RF conductivity at the desired frequency, then the thickness of the copper outer layer can be reduced to fall below the skin effect at the desired frequency. Examples of methods used to reduce the thickness of the copper outer layer include chemical etching, electrochemical etching or uniform mechanical polishing. EP Patent Publication Number 0342 669A2 provides an example of an etch method that can be used and is incorporated herein by reference. These methods are well known in the art and one of ordinary skill in the art can easily choose the method to use to reduce the thickness of the copper outer layer to the desired thickness, while maintaining or even improving the smoothness of the final copper surface. Determining the appropriate thickness of the copper outer layer for the frequency of the end application would be well within the skill of one of ordinary skill in the art.

At least a part of the outer shell of the inner core and the copper outer layer must have a crystallographic orientation. The outer shell and copper outer layer must also be thin enough to ensure that the RF conductivity is enhanced. Preferably, this copper outer layer would be less than 2 microns if the ultraconductive copper composite cylindrical configuration is to be used in 1 GHz applications.

Chemical vapor deposition (CVD) can be used to deposit the graphene on the outer shell of the inner core. CVD provides for growth of large areas of graphene that conform to the outer sheller layer. CVD occurs in a hydrogen/argon atmosphere. Methane is introduced as a precursor gas into a quartz tube so that the methane reacts to provide atomic carbon, which is deposited on the outer shell of the inner core. The resulting graphene film is polycrystalline and may possibly have defects in the form of a one-dimensional grain boundary. CVD of the graphene may be conducted at temperatures from about 800° C. to about 1085° C. for about a period of 15 to about 45 minutes. Most preferably, the CVD is conducted at a temperature of about 900° C. to about 1085° C. Shorter CVD periods may result in gaps in coverage of the graphene on the outer shell. Alternatively, any other precursor gas such as ethylene, acetylene, ethane or propane can be used to provide atomic carbon to the copper layer. Furthermore, it is possible to use arc-evaporation and plasma enhanced CVD to deposit graphene on the copper layer It is believed that the atomic spacing in the copper layer closely matches the graphene lattice constant facilitating the growth of the graphene layer. The carbon atom lattice of the graphene film attached to the copper layer may promote the formation of an abundance of electron transfer tunnels. Hence, the electrical properties of the material are improved overall.

Although an ultraconductive copper composite cylindrical conduit is described with an inner core, an outer shell, a graphene layer and an outer copper layer, any multi-layer ultraconductive copper composite cylindrical structure with as many layers as desired can be formed provided that the outer shell, graphene layer and outer copper layer are sufficiently close to the external surface of the cylindrical conduit to enhance the RF conductivity of the ultraconductive copper composite cylindrical conduit to provide for enhanced RF conductivity for the desired end application.

Optionally, a thin layer of an organic or metallic material can be placed on an exposed surface of the composite to protect the copper layer from corrosion. An example of a metallic material is silver. If a metallic material is used to prevent the corrosion, it cannot compromise the conductivity of the composite.

The present invention also relates to a method for forming an ultraconductive copper cylindrical conduit that possesses improved RF conductivity over copper conduits alone.

Figure 2:
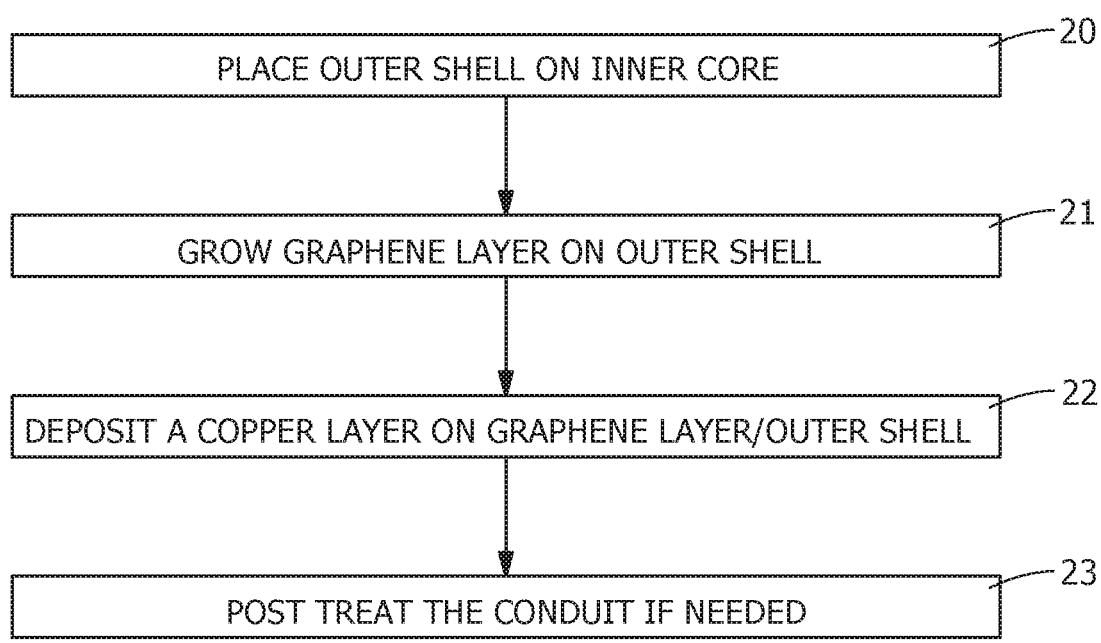
FIG. 2 shows a flow diagram illustrating the method of forming an ultraconductive copper cylindrical conduit having improved RF conductivity.

FIG. 2 is a flow diagram of the method for forming an ultraconductive copper cylindrical conduit according to the instant invention. In the first step 20, a inner core is obtained. An outer shell is placed on the inner core. The outer shell can be made of any material that is suitable for growth of a graphene layer. Preferably, the outer shell is made of copper. If copper is used as the outer shell, any known method to deposit copper on the inner core can be used. In the next step 21, a layer graphene is deposited on an outer shell by use of chemical vapor deposition as described above.

In the next step of the process 22, an outer layer of copper is deposited on the graphene layer. Suitable methods to place or deposit the copper on the graphene film include electrodeposition, vacuum deposition, sputtering, laminating, rolling. U.S. Pat. No. 6,770,976 B2 describes an example of a method for forming a relatively thin release layer of copper on a carrier substrate and is incorporated herein by reference. These methods are well known in the art and one of ordinary skill in the art can easily choose the best method to achieve the desired result. If a substrate is used with the copper, the substrate must be easily removable from the copper without damage to the copper itself.

If needed, the outer copper layer may be post-treated 23. For example, any operation to make the outer surface smoother would be acceptable. The post-treatment can be either thermal or mechanical post-treatment as needed to further enhance the RF conductivity. Examples of such possible post treatment methods include electromagnetic forming, swaging/extrusion. Also after the post-treatment, if the outer copper layer is too thick to achieve the desired enhancement of RF conductivity at the frequency the conduit will be used, then the thickness of the outer copper layer can be reduced to fall below the skin effect at the desired frequency. Examples of methods used to reduce the thickness of the copper outer layer include chemical etching, electrochemical etching, or uniform mechanical polishing. If chemical etching is used, the roughness of the foil is reduced. These methods are well known in the art and one of ordinary skill in the art can easily choose the method to use to reduce the thickness of the copper outer layer to the desired thickness, while maintaining or even improving the smoothness of the final outer copper layer. Determining the appropriate thickness of the copper outer layer for the frequency of the end application would be well within the skill of one of ordinary skill in the art.

The instant invention has been described with a cylindrical configuration. Any other shape or configuration for conductor can be used in place of a cylindrical configuration. Determining the appropriate configuration is well within the skill of one of ordinary skill in the art.

The present invention also relates to the synthesis of ultraconductive metal-carbon composites on a cylindrical substrate in which the cylindrical substrate possesses improved RF conductivity over cylindrical substrate itself. Preferably, the cylindrical substrate is used as a conductor in frequencies from about 0.5 MHz to about 60 GHz.

A method of the instant invention starts with a cylindrical substrate. Preferably, the cylindrical substrate is a conductor. The conductor can be any wire or bundle of wires having a desired thickness and electrical properties. Examples of suitable materials for the wire include copper, or any alloy thereof. Alternatively, the conductor can be any conductor material having an outer layer of copper. If such a conductor is used, the outer layer of copper can be coated, plated or clad onto the conductor. An example of such a conductor is copper clad stainless steel. The conductor is chosen to achieve the desired end result and can easily be determined by one of ordinary skill in the art.

Figure 3:
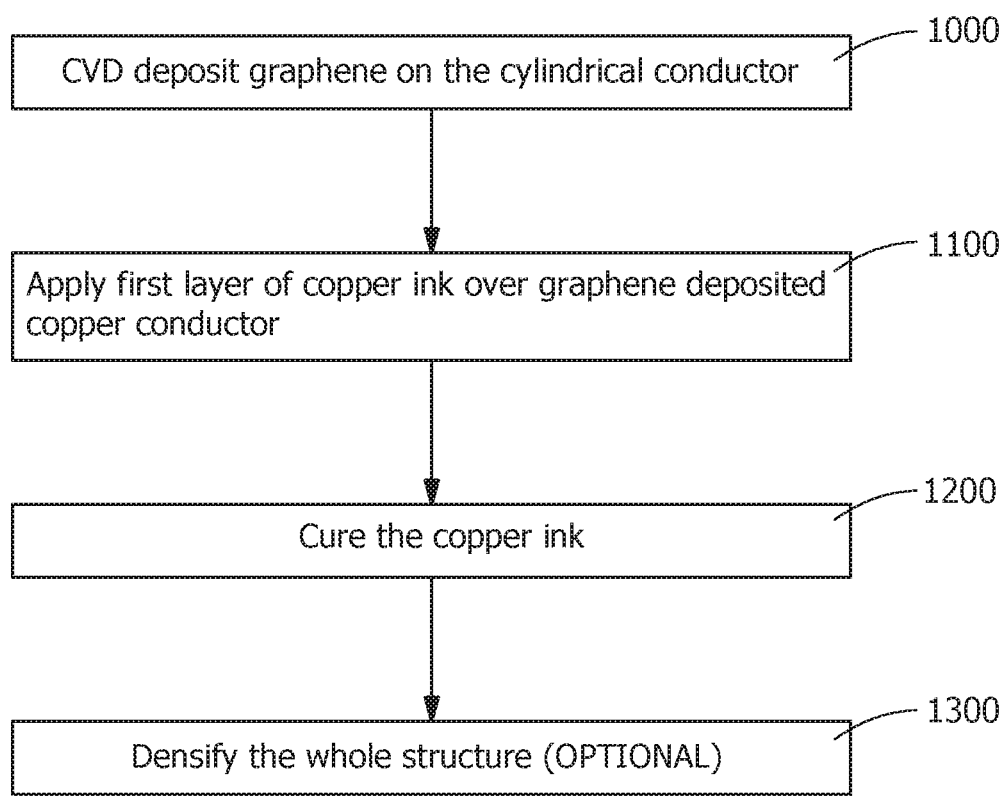
FIG. 3 shows a flow diagram illustrating an embodiment of the method to form an ultraconductive metal-carbon composite having enhanced RF conductivity on a cylindrical conduit.

In an embodiment of the instant invention shown in FIG. 3, graphene is deposited on the conductor in the first step 1000. Any method to deposit or grown graphene on the conductor can be used. In the second step of the process 1100, a copper ink is applied to the conductor containing a graphene layer. Any coating technique or conductive ink printing technique can be used to apply the copper ink to the conductor. Coating techniques such as dip coating or spray coating are examples of the coating techniques that can be used in the instant invention. Any other coating technique known can also be used and would be easily used by one of ordinary skill in the art. Examples of conductive ink printing techniques include inkjet printing, pad printing, flexo, gravure, dispense jet, or aerosel jet printing. Any other conductive ink jet printing technique can be used and would be easily determined by one of ordinary skill in the art.

Any copper ink that provides a thin coating can be used. Depending upon the skin depth requirement, the coating thickness can be adjusted based upon the particle size, ink properties and printing technique to ensure that the RF conductivity of the conductor is improved. Copper inks generally are comprised of copper particles (0.01-10 μm) suspended in a mixture of organic solvents. Any copper ink having copper particles in the range of several nanometers to 10s of microns can be used. An example of a nanoparticle ink can be found in U.S. Pat. No. 10,047,236. By using a nanoparticle copper ink, one could achieve a high surface to volume ratio gas permeable layer that would possibly facilitate faster graphene growth as well as better coverage of the graphene. The ratio of the organic content of the ink to the solid filler should be less than 20:80. Most preferably, the ratio of the organic content of the ink to the solid filler should be 5:95. Alternatively, particle free copper inks can be used. process is the chemical vapor deposition process.

In the third step of the process 1200, shown in FIG. 3, the copper ink is cured. Examples of suitable curing methods that can be used include conventional heating, ultraviolet curing, infrared heating or photonic sintering/curing. Any curing method can be used provided that the desired results are obtained and would be well within the scope of one of ordinary skill in the art. This third step of curing can occur anywhere in the range of about 120° C. to about 800° C. The curing time for this step can take anywhere from a few seconds up to an hour to ensure that all the solvent is evaporated and any residual organic content is cured or possibly even partially or fully decomposed.

Another important consideration in reducing losses in transmission lines is the ability to control the surface roughness of the conductor. A discussion related to the roughness can be found in U.S. Pat. No. 9,287,599, which is incorporated herein by reference. Depending upon the geometrical factor of the conductor and the ratio of the root mean square ("RMS") of the surface roughness to the skin depth, attenuation in the transmission lines can be as high as a factor of 2. To minimize such losses, the roughness of this copper layer is preferably less than the skin depth over the frequency range of interest. Typical RMS roughness of a rolled annealed copper is 0.3 microns. Producing layers of copper with RMS roughness less than 0.3 microns would be ideal to effectively reduce losses. Most preferably, the copper layer would have an RMS roughness of less than 0.1 microns.

The entire structure can then be optionally densified in the next optional step 1300. Densification can be achieved by means of thermal processing, laser welding, e-beam welding, arc welding or solid-state ultrasonic welding. The type of method chosen for densification is well within the scope of one of ordinary skill in the art. The densified structure has a root mean surface roughness less than 0.3 µm, and preferably less than 0.1 µm.

Figure 4:
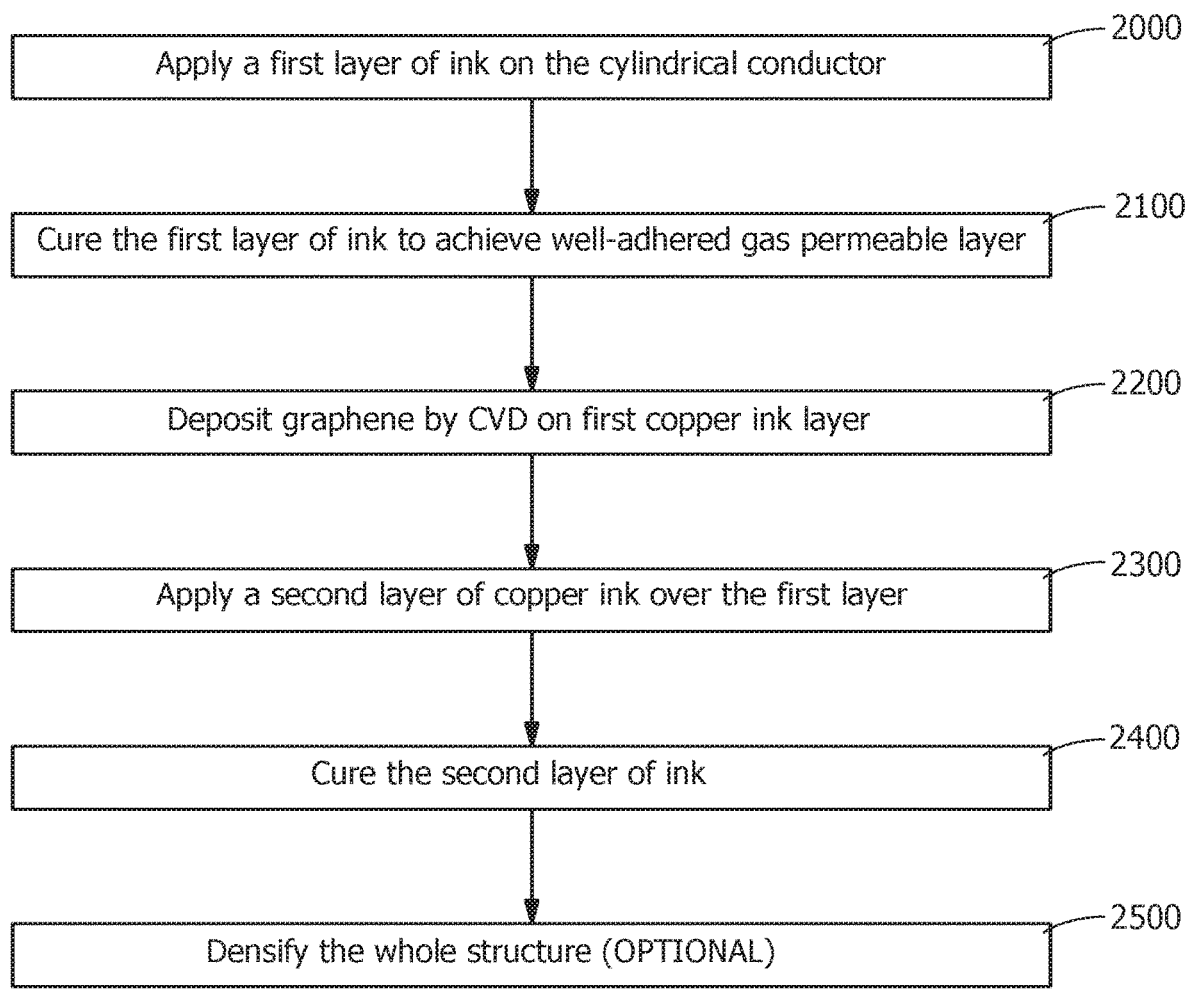
FIG. 4 shows a flow diagram illustrating an alternative embodiment of a method to form an ultraconductive metal-carbon composite having enhanced RF conductivity on a cylindrical conduit.

A flow diagram describing the further method which can be used in this invention can be seen in FIG. 4. A first layer of copper ink is placed on the cylindrical conduit 2000. Any copper ink that provides a thin coating can be used. Copper inks as described above are generally comprised of copper particles suspended in a mixture of organic solvents. The ratio of the organic content of the ink to the solid filler should be less than 20:80. Most preferably, the ratio of the organic content of the ink to the solid filler should be 5:95. Preferably, the copper ink layer in this embodiment is sufficiently permeable that the subsequent deposition of graphene enables simultaneous graphene growth both on top and underneath the surface of the copper ink.

In the second step of this embodiment 2100, the first layer of copper ink is cured to achieve a well-adhered gas permeable copper layer on the conduit. Any curing method can be used provided that the desired results are obtained and would be well within the scope of one of ordinary skill in the art. This second step of curing can occur anywhere in the range of about 120° C. to about 800° C. The curing time for this step can take anywhere from a few seconds up to an hour to ensure that all the solvent is evaporated and any residual organic content is cured or possibly even partially or fully decomposed. Alternatively, the first layer of copper ink can be cured during the next step.

In the third step of this embodiment 2200, graphene is deposited on the gas permeable copper layer. Any method to deposit or grown the graphene on the gas permeable copper layer can be used. Preferably, CVD is used. CVD of the graphene may be conducted at temperatures from about 800° C. to about 1085° C. for about a period of about 5 minutes to about 45 minutes.

In the fourth step of this embodiment 2300, a second layer of copper ink in then applied. Any copper ink described above can be used provided that the desired results are achieved.

Next, in the fifth step of this embodiment 2400, the copper ink is then cured. Any curing method can be used provided that the desired results are obtained and is well within the scope of one of ordinary skill in the art. Generally, this curing step occurs in the temperature range of about 120° C. to about 800° C. for about a few seconds up to an hour. Alternatively, this step is omitted, and the curing of the copper ink occurs at densification.

The final step of this embodiment is yet another optional step 2500. The entire conduit may optionally be densified. Densification can be achieved by means of thermal processing, laser welding, e-beam welding, arc welding or solid-state ultrasonic welding. The type of method chosen for densification is well within the scope of one of ordinary skill in the art.

Figure 5:
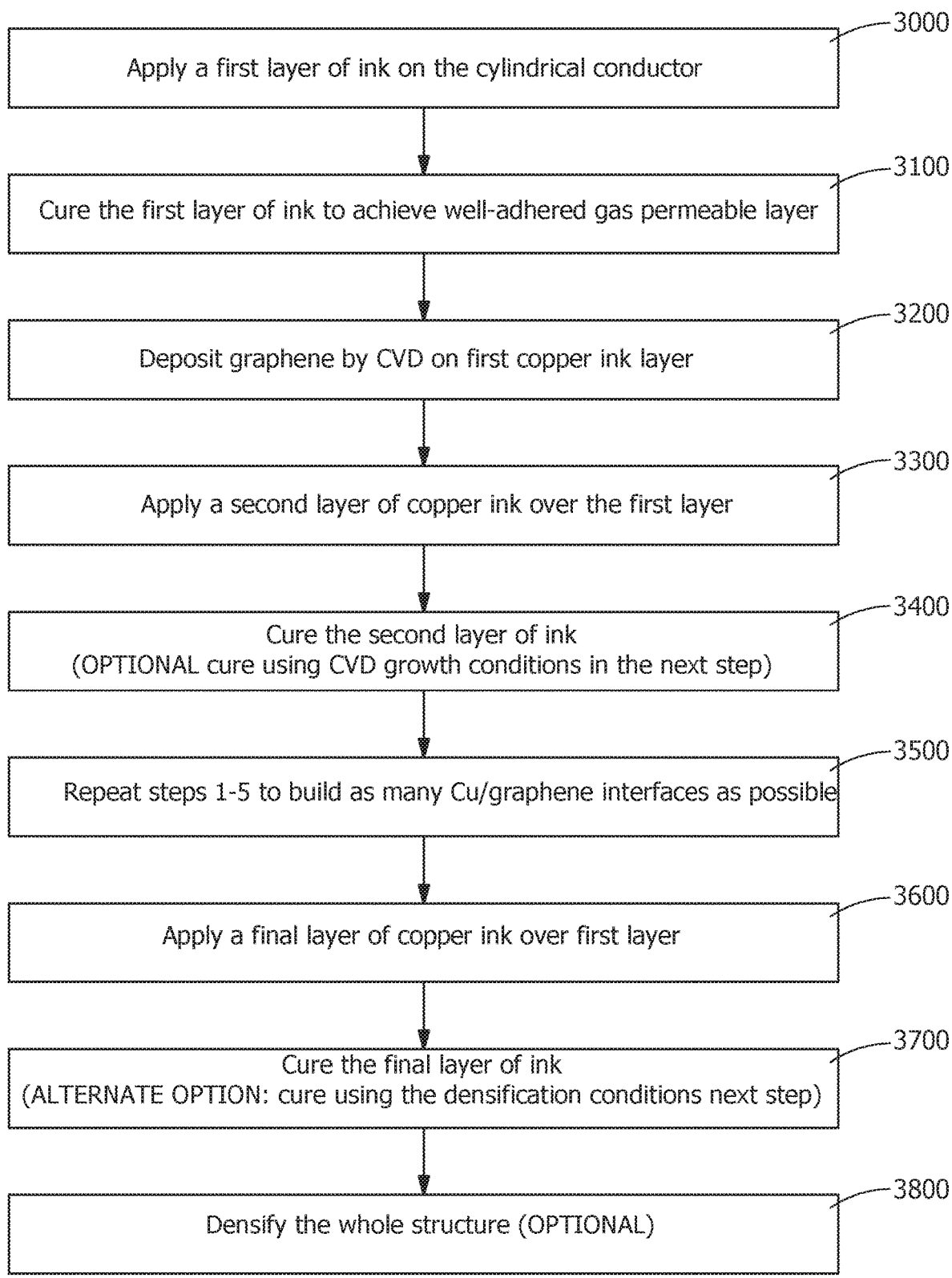
FIG. 5 shows a flow diagram illustrating yet another alternative embodiment of the method to form an ultraconductive metal-carbon composite having enhanced RF conductivity on a cylindrical conduit.
Figure 6:
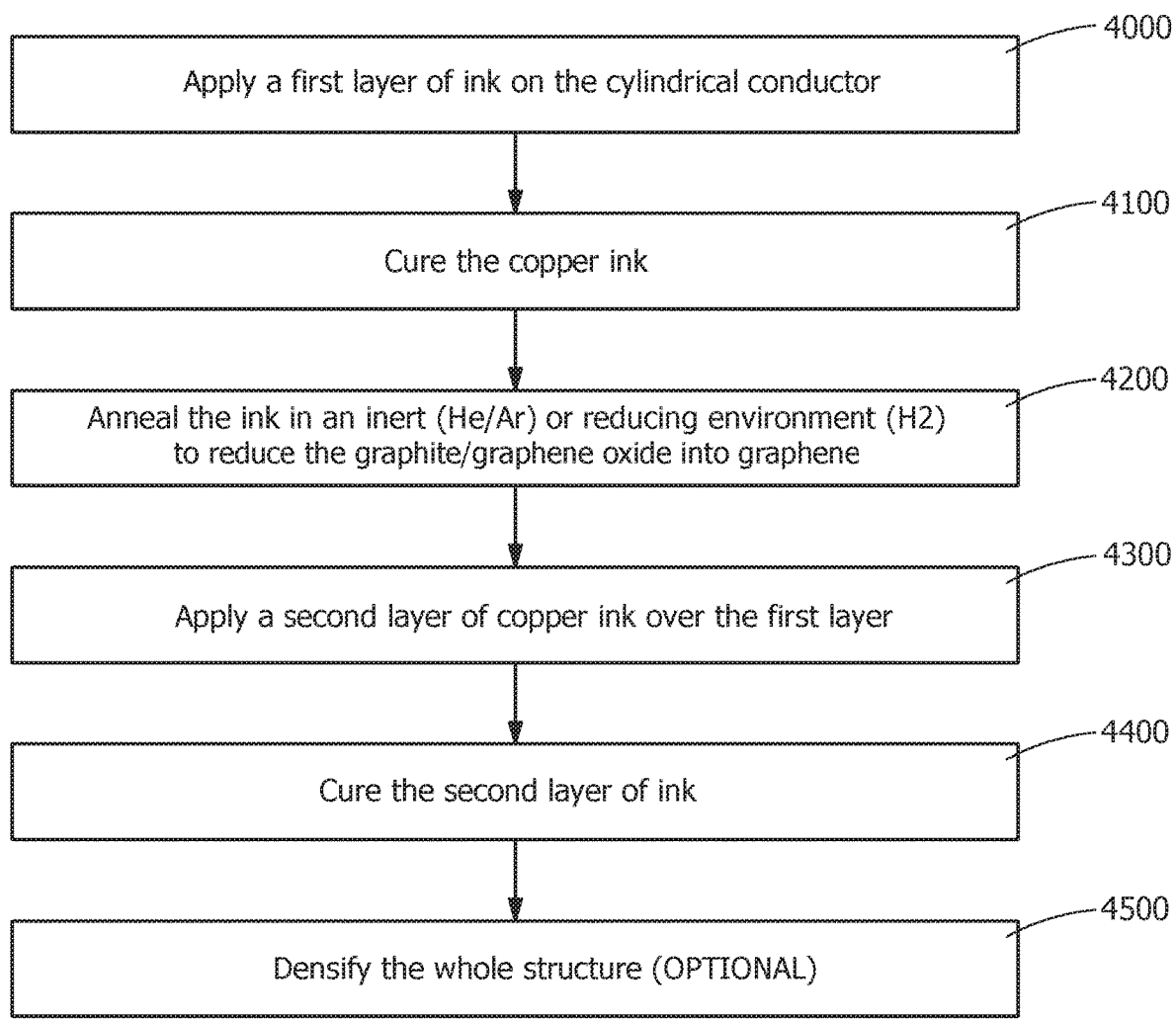
FIG. 6 shows a flow diagram illustrating yet another alternative embodiment of the method to form an ultraconductive metal-carbon composite having enhanced RF conductivity on a cylindrical conduit

Yet a further method which can be used in this invention is shown in FIG. 5. In the first step of this embodiment 3000, a first layer of copper ink is placed on the cylindrical conduit. Any copper ink described previously can be used in this third embodiment.

The copper ink is then cured in the second step of this embodiment 3100. Any curing method can be used provided that the desired results are obtained and is well within the scope of one of ordinary skill in the art. Generally, this curing step occurs in the temperature range of about 120° C. to about 800° C. for about a few seconds up to an hour. The cured copper ink forms a gas permeable layer on the cylindrical conduit. Alternatively, this step may be omitted, and the first layer of copper ink can be cured during the subsequent step.

Graphene is then deposited on the gas permeable layer formed by the first layer of copper ink in the third step 3200 of the embodiment of FIG. 5. Any method to deposit or grown graphene on the gas permeable layer can be used. Most preferably, CVD may be used at a temperature of about 800° C. to about 1085° C. for about 15 to about 45 minutes.

A second layer of copper ink is then applied over the graphene in the next step 3300. Any copper ink described above can be used.

The second layer of copper ink is then cured in the following step 3400. Any curing method can be used provided that the desired results are obtained and is well within the scope of one of ordinary skill in the art. Generally, this curing step occurs in the temperature range of about 120° C. to about 800° C. for about a few seconds up to an hour. The cured copper ink forms a gas permeable layer on the cylindrical conduit. Optionally, the second layer can be cured using the CVD growth condition if additional copper/graphene layers are being added.

The steps set forth above can be repeated to obtain as many copper/graphene layers are desired or necessary to achieve the desired electrical properties of the cylindrical substrate 3500. Determining the appropriate number of copper/graphene layers needed to achieve the desired properties would be well within the skill of one of ordinary skill in the art. By using this method, one can ensure that the ultraconductive material on the conduit is close the surface of the conduit thereby enhancing the overall (DC) conductivity as well as the RF conductivity of the conduit. For the preferred frequencies that the conduit would be used, the skin depth is equal to or greater than the radius of the conduit. When the skin depth is less than the wire radius, preferably less layers would be needed to achieve the enhanced RF conductivity.

Figure 7:
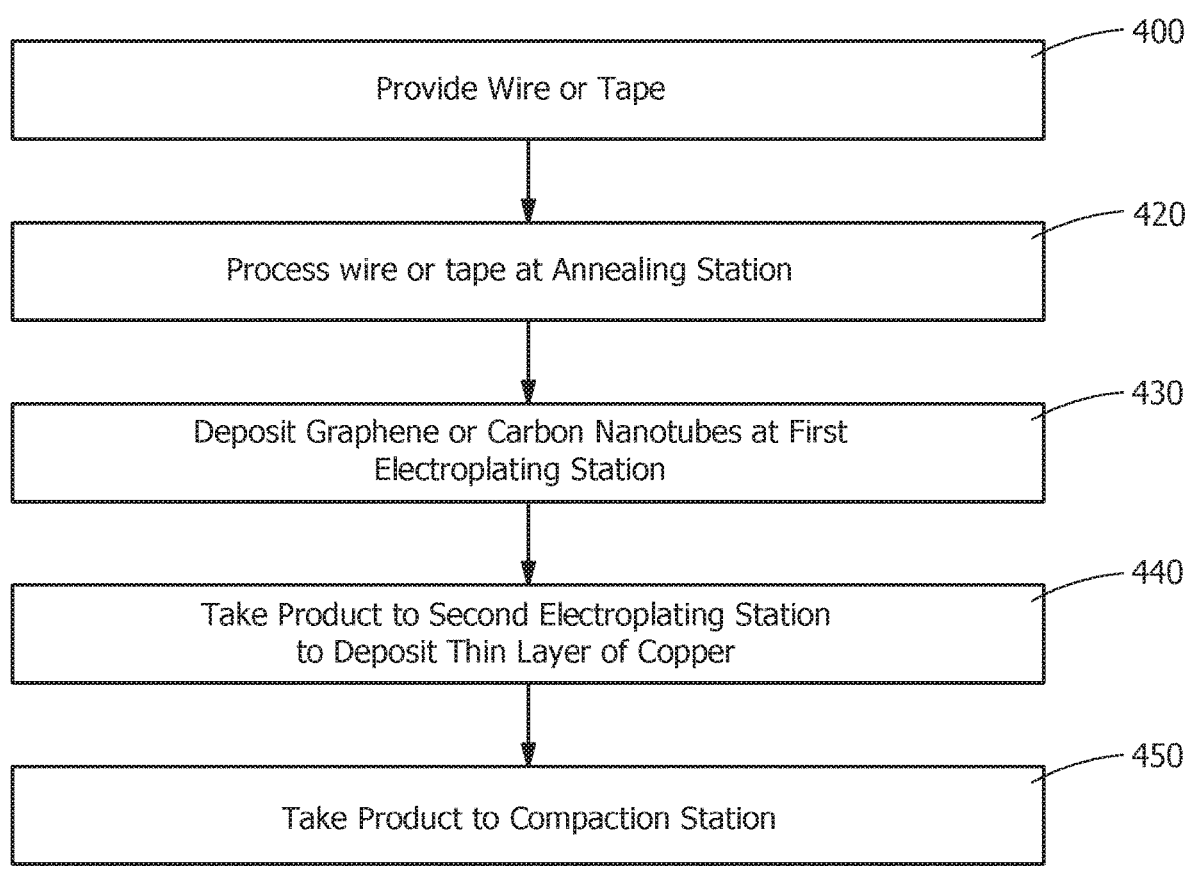
FIG. 7 shows a flow diagram illustrating a reel to reel process for forming an ultraconductive metal-carbon composite wire and tape.

In the next step 3600 of the process of FIG. 5, a final layer of copper ink is placed on the conduit thereafter. The final layer of copper ink can then be cured as shown in FIG. 7 flow diagram 3700. Any curing method described above can be used. If the structure is to be optionally densified, this curing step may be omitted as the ink will be cured by the densification step.

The entire structure is then optionally densified 3800. Any of the methods described above for densification can be used in this process.

Yet a further method which can be used in the instant invention can be found in FIG. 7. In this embodiment, a first layer of copper ink with graphite oxide/graphene oxide is placed on the cylindrical conduit 4000.

In the second step of the embodiment 4100, the copper ink is cured. Alternatively, this step can be omitted, and the copper ink cured during the next step in which the conduit is annealed.

In the next step 4200, the cooper ink can be annealed in an inert environment or reducing environment to reduce the graphite/graphene oxide into graphene. Annealing can occur in an inert environment such as argon, helium or aluminum or titanium getter in a flowing argon or helium gas at temperatures from about 800° C. to about 1085° C. for a period of about 15 to about 45 minutes. Alternatively, the copper ink can be annealed in a reducing environment of hydrogen gas at a temperature from about 800° C. to about 1085° C. for a period of about 15 to about 45 minutes. One of ordinary skill in the art would be able to determine the parameters for the annealing process in view of the desired end result. It is believed that mixing the graphite/graphene oxide in the ink can enable the growth of graphene not just on the top surface of the copper ink but on any surface of the copper ink that is exposed to the graphite/graphene oxide. This enables the formation of multiple sub layers of graphene-copper interface, thereby enhancing the conductivity beyond a single continuous graphene/copper/graphene interface.

In this embodiment, a second layer of copper ink is then applied over the first layer 4300. Any copper ink described above can be used. The second layer of copper ink is then cured 4400. Alternatively, if the optional densification step is to be used 4500, then the second layer of copper ink can be cured during the densification process.

It is believed that the atomic spacing in the copper layer closely matches the graphene lattice constant, facilitating the growth of the graphene layer. The carbon atom lattice of the graphene film attached to the copper layer may promote the formation of an abundance of electron transfer tunnels. Hence, the electrical properties of the material are improved overall.

Another embodiment of the invention is also a cylindrical conduit made using the any one of the alternative methods of making an ultraconductive metal-carbon composite described above having improved RF conductivity. The cylindrical conduit has a conductor, an copper gas permeable overlay formed on the conductor due to the curing of copper ink placed on the conductor. The conductor also has a graphene layer deposited on the gas permeable copper layer. Additional layers of copper with graphene may be added. The number of layers can be determined by one of ordinary skill in the art so that the bulk (DC) conductivity as well as RF conductivity are increased. The cylindrical conduit can then be subject to optional densification process as described above.

The present invention also relates to a continuous reel to reel process for forming an ultraconductive metal-carbon composite wire or tape which possesses improved RF conductivity. Preferably, the ultraconductive metal-carbon composite wire or tape is used at a frequency in the range of about 50 kHz to about 20 GHz. In addition, the invention relates to the use of such wire or tape in various applications.

As shown in the flowchart of FIG. 7, the reel to reel process of the instant invention starts with a cylindrical substrate 400 The cylindrical substrate is preferably a metal wire. Examples of suitable wires include copper and silver alloys. Most preferably, the metal wire is a copper wire. Any other metal material can be used for the wire provided that it has the desired properties in the end product.

In the first step of the reel to reel process, the metal wire is processed at an annealing station 420. At this annealing station, the grains of the metal wire are oriented in order to obtain the desired crystal orientation to enhance carbon nanotube or graphene growth on the metal wire. At this annealing station, the desired crystal orientation on the surface of the metal wire can be obtained by annealing with a controlled cooling rate. Control of the cooling rate can be accomplished either by drawing the metal wire through an oven with a suitable temperature gradient and a given transverse rate or by use of a pulsed energy source such as by laser or electron beam. The conditions for this annealing station are well known and can easily be determined by one of ordinary skill in the art in order to obtain the desired crystal orientation on the metal wire to enhance the carbon nanotube or graphene growth.

In the second step of the reel to reel process, the metal wire is moved to an electroplating station 430. A carbon nanotube or graphene layer is applied to the metal wire. In this reel to reel process, the wire is drawn through the bath at a high speed to create the needed fluid shear through relative motion between the moving wire and the fixed bath. Preferably, additional fluid shear may be obtained by passing the wire though the center of a venturi nozzle which would increase the local fluid velocity. The size of the venturi nozzle can easily be determined by one of ordinary skill in the art to obtain the increase in the desired local fluid velocity.

Carbon nanotubes have hollow cylindrical nanostructures formed of carbon with typical diameters from 0.4 to 100 nm. Carbon nanotubes are composed of a single layer of carbon atoms in a cylindrical configuration. Their unique structure and $sp^3$ chemical bonds are believed to impart superior electrical, mechanical and thermal properties to the material.

In the next step of the reel to reel process as shown in FIG. 7, the coated wire is moved to a second electroplating station 440. At this second electroplating station, an outer layer of copper is applied to the coated wire. Any known electroplating or electrodeposition process can be used. For example, the coated wire can be continuously fed into a tank containing an electrolytic solution comprising copper ions. A current is applied to the tank by any known method and an electrodeposited copper layer is deposited onto the wire having a graphene or carbon nanotube layer. The copper is preferably deposited into the wire for a sufficient amount of time to form the desired thickness of the outer copper layer. The coated wire can be used for any frequencies in the range of about 50 kHz to about 60 GHz. With this range of frequencies, the wire will have enhanced RF conductivity if the skin depth is equal to or greater than the radius of the original wire prior to processing. The time for depositing as well as the determination of the sufficient thickness to have enhanced RF conductivity can easily be calculated by one of ordinary skill in the art. As described above, an optional thin layer of an organic or metallic material can be placed on the copper layer to prevent corrosion of the copper.

It is believed that the reel to reel process of the instant invention promotes the formation of an abundance of electron transfer tunnels. Hence, the electrical properties of the wire are improved overall.

In the final step of the reel to reel process, the wire is moved to a compaction station 450. The compaction station can use either heat or pressure or both heat and pressure to consolidate the layers and to cause the carbon nanotubes and/or graphene to diffuse into the copper grains. Preferably, using the two separate energy sources, enables the necessary diffusion process to take place at a lower temperature and in less time than if thermal diffusion was used by itself. Using the two separate energy sources in such a manner reduces the tendency for the grain boundaries to lose the beneficial alignment which is achieved by the prior steps resulting in the overall improvement of the electrical properties of the wire.

Pressure can be applied by either drawing the wire through a die to slightly reduce its diameter through mechanical compression, or by passing it through an electromagnetic forming device. If the wire is passed through an electromagnetic forming device, magnetic energy applies a radial Lorenz force acting inwardly on the wire. An example of electromagnetic forming can be found at Fraunhofer Institute for Machine Tools and Forming Technology IWU at http://www.iw.fraunhofer.de, in a brochure, "Electromagnetic Forming", having a copyright of 2016, incorporated herein by reference in its entirety. In addition, the compaction station uses some heat.

The reel to reel process described above can be used for ultrasonic probe cables for ultrasonic probes. Ultrasonic probes consist of an array of sensors, each with its own driver and signal processing electronics. The processing hardware generates heat, so as to avoid excess heating of the probe that contacts the human body, the signals from the array are conveyed to the processing hardware through a cable bundle in which each signal in the array requires a separate wire. Wires formed according to the instant method would enable the construction of higher performance ultrasonic probe cables.

The reel to reel process described above can be used to form tapes. The tapes may optionally be subject to one additional compaction station. The properties for this final compaction station can easily be determined by one of ordinary skill in the art to achieve the desired final properties for the tapes. Tapes offer an increased surface to volume ratio over wires, which provides for better electrical performance than wires of equal volume. The tapes formed by the process of this invention can be easily used for electric motors and solenoids.

While the invention has been described with reference to a preferred embodiment, it will be understood by those skilled in the art that various changes may be made and equivalents may be substituted for elements thereof without departing from the spirit and scope of the invention as defined in the accompanying claims. One skilled in the art will appreciate that the invention may be used with many modifications of structure, arrangement, proportions, sizes, materials and components and otherwise used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

The invention claimed is:

1. An ultraconductive copper composite cylindrical conduit having an outer surface and enhanced RF conductivity, said conduit comprising an inner core, a shell comprising copper placed directly on and surrounding said inner core, a graphene layer directly on said shell, and an outer copper layer being deposited on said graphene layer to form the outer surface, wherein said shell, graphene layer and outer copper layer are sufficiently close to the outer surface thereby enhancing the RF conductivity of the conduit over a cylindrical conduit comprising copper alone.

2. The ultraconductive copper composite cylindrical conduit according to claim 1, wherein said inner core is formed of copper.

3. The ultraconductive copper composite cylindrical conduit according to claim 1, wherein said inner core is copper nickel silicon alloy.

4. The ultraconductive copper composite cylindrical conduit according to claim 1, wherein said inner core is stainless steel.

5. A method of forming an ultraconductive copper composite cylindrical conduit having an outer surface, said method comprising placing a shell comprising copper directly on an inner core, growing a graphene layer on said shell, and depositing a copper layer on said graphene layer to form the outer surface, wherein said shell, said graphene layer and said outer copper layer are sufficiently close to the outer surface, thereby enhancing the RF conductivity of said conduit.

6. The method according to claim 5, wherein said inner core is a copper nickel silicon alloy.

7. The method according to claim 5, wherein said inner core is stainless steel.

* * * * *